(12) United States Patent
Miyamoto et al.

(10) Patent No.: US 8,835,099 B2
(45) Date of Patent: Sep. 16, 2014

(54) LITHOGRAPHIC PRINTING PLATE PRECURSOR

(75) Inventors: Yasushi Miyamoto, Tatebayashi (JP); Yasuhiro Asawa, Oata (JP); Maru Aburano, Gunma-ken (JP); Eiji Hayakawa, Utsunomiya (JP); Satoko Kumazumi, Gunma-ken (JP)

(73) Assignee: Eastman Kodak Company, Rochester, NY (US)

( * ) Notice: Subject to any disclaimer, the term of this patent is extended or adjusted under 35 U.S.C. 154(b) by 196 days.

(21) Appl. No.: 13/322,922

(22) PCT Filed: May 31, 2010

(86) PCT No.: PCT/JP2010/059575
§ 371 (c)(1),
(2), (4) Date: Nov. 29, 2011

(87) PCT Pub. No.: WO2010/140697
PCT Pub. Date: Dec. 9, 2010

(65) Prior Publication Data
US 2012/0070779 A1     Mar. 22, 2012

(30) Foreign Application Priority Data
Jun. 2, 2009 (JP) ................................ 2009-133358

(51) Int. Cl.
| | | |
|---|---|---|
| *B41M 5/00* | (2006.01) | |
| *B41N 1/00* | (2006.01) | |
| *G03F 7/00* | (2006.01) | |
| *G03F 7/26* | (2006.01) | |
| *G03F 7/11* | (2006.01) | |
| *B41C 1/10* | (2006.01) | |

(52) U.S. Cl.
CPC ............. *G03F 7/11* (2013.01); *B41C 2201/04* (2013.01); *B41C 1/1008* (2013.01)
USPC ................ 430/271.1; 430/270.1; 430/281.1; 430/302; 101/453; 101/463.1

(58) Field of Classification Search
USPC ................................ 430/156, 159, 270.1–309
See application file for complete search history.

(56) References Cited

U.S. PATENT DOCUMENTS

| | | | |
|---|---|---|---|
| 3,510,307 A | 5/1970 | Borchers, et al. | |
| 4,689,272 A | 8/1987 | Simon et al. | |
| 5,368,974 A * | 11/1994 | Walls et al. | 430/156 |
| 2002/0068240 A1 | 6/2002 | Teng | |
| 2006/0166137 A1 * | 7/2006 | Mitsumoto et al. | 430/270.1 |
| 2007/0172766 A1 | 7/2007 | Teng | |
| 2011/0011291 A1 * | 1/2011 | Hotate et al. | 101/463.1 |

FOREIGN PATENT DOCUMENTS

| | | |
|---|---|---|
| EP | 0 626 273 A1 | 11/1994 |
| JP | 06-059455 | 3/1994 |
| JP | 2010-085765 | 4/2010 |
| WO | WO 2009113378 A1 * | 9/2009 |

* cited by examiner

*Primary Examiner* — Chanceity Robinson
(74) *Attorney, Agent, or Firm* — J. Lanny Tucker

(57) ABSTRACT

The present invention provides a lithographic printing plate precursor which exhibits satisfactory ink cleanup and restart toning characteristics during printing.

Disclosed is a lithographic printing plate precursor comprising a substrate having thereon in order an interlayer containing a copolymer comprising K units and L units, and an image-forming layer, wherein
said K unit is derived from a monomer of the formula I:

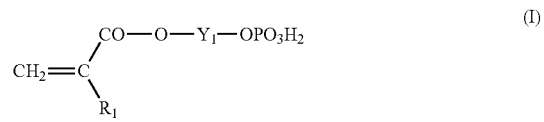

(I)

wherein $R^1$ represents a hydrogen atom, a $C_{1-22}$ linear, branched or cyclic alkyl group, a $C_{1-22}$ linear, branched or cyclic, substituted alkyl group, a $C_{6-24}$ aryl group or substituted aryl group, wherein the substituent is selected from a $C_{1-4}$ alkyl group, an aryl group, a halogen atom, a keto group, an ester group, an alkoxy group, or a cyano group; Y represent a single bond, or a $C_{1-22}$ linear, branched or cyclic alkylene; or $CH_2$=$CHPO(OH)_2$; and said L unit is derived from a monomer of the formula II:

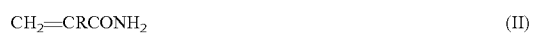

$CH_2$=CRCONH$_2$      (II)

wherein R is H or $CH_3$, and said K units are present from more than 3% and less than 40% and said L units are present from more than 60% and less than 97% in the copolymer.

19 Claims, No Drawings

LITHOGRAPHIC PRINTING PLATE PRECURSOR

TECHNICAL FIELD

The present invention relates to a lithographic printing plate precursor. More particularly, the present invention relates to a lithographic printing plate precursor comprising an interlayer between a substrate and an image-forming layer.

BACKGROUND ART

The art of lithographic printing is based upon the immiscibility of oil and water, wherein an ink is preferentially retained by the image areas and the water or a fountain solution is preferentially retained by the non-image areas. When a suitably prepared surface is moistened with water and an ink is then applied, the background or non-image areas retain the water and repel the ink while the image areas accept the ink and repel the water. The ink on the image areas is then transferred to the surface of a material upon which the image is to be reproduced, such as paper, cloth and other materials. Commonly, in offset printing, the ink is transferred to an intermediate material referred to as a blanket which in turn transfers the ink to the surface of the material upon which the image is to be reproduced.

A widely used type of lithographic printing plate precursor has an image-forming layer applied on a substrate. The layer may respond to light under exposure and become soluble so that it is removed during development. Such a plate is referred to as a positive working plate. Conversely, when an image-forming layer is exposed to light and is hardened so that it remains on the substrate during development, such a plate is referred to as a negative working printing plate. In both instances, the portion including the remaining image-forming layer is the image area and is ink-receptive or oleophilic. The portion where the image-forming layer has been removed is the non-image area or background and is water-receptive or hydrophilic.

Since the non-image area or background of the lithographic printing plate is the portion where the image-forming layer has been removed during development, the substrate under the image-forming layer is exposed. Although the substrate used for the lithographic printing plate precursor is usually a metal plate, a plastic film or a composite material, the material per se has no hydrophilicity. When the substrate is made of the metal plate, it is usually subjected to a roughening treatment so as to impart water retentivity. An interlayer capable of imparting hydrophilicity is usually provided between the substrate and the image-forming layer.

There have conventionally been used, as the material capable of imparting hydrophilicity of the interlayer, for example, polyvinylphosphonic acid, polyacrylic acid, polyacrylamide, silicate, zirconate and titanate.

Japanese Unexamined Patent Publication (Kokai) No. 06-340720 describes that a thermally crosslinkable hydrophilic copolymer including polymer chains composed of four kinds of monomer units having an acid side group and a base side group is used to hydrophilized a lithographic printing plate. The publication describes that acrylic acid, methacrylic acid, maleic acid, fumaric acid, itaconic acid, a maleic acid monoester, a fumaric acid monoester, an itaconic acid monoester, vinylsulfonic acid, vinylbenzoic acid or vinylphosphonic acid is used as the acid side group, while dimethylaminoethyl acrylate or vinyl pyridine is used as the base side group.

Japanese Unexamined Patent Publication (Kokai) No. 2008-511858 describes an interlayer of a lithographic printing plate, which comprises a copolymer including a polyalkylene oxide unit and a unit derived from vinylphosphonic acid and optionally a (meth)acrylamide unit.

International Publication No. WO 2005/010613 pamphlet describes that a photosensitive lithographic printing plate having an aluminum substrate which is treated with an aqueous alkali metal salt solution and is also treated with a polyvinylphosphonic acid solution or an aqueous polymer solution of an unsaturated acid having a carboxyl group.

It has been known that it is possible to obtain a lithographic printing plate capable of obtaining printed matter, which is free from stain during printing, by pre-treating the substrate with such a compound. However, in the printing plate subjected to a hydropholization treatment, various stains may be generated according to materials (paper, ink, fountain solution, etc.) to be used and printing conditions.

Recently, a copolymer of vinylphosphonic acid and (meth)acrylic acid has often been used as the material of the interlayer. However, the interlayer made of this copolymer is inferior in ink cleanup characteristics. It is known that a carboxyl group of (meth)acrylic acid is converted into an acid form when an acidic fountain solution is used, thus causing a problem such as restart toning.

It was found that a lithographic printing plate comprising an interlayer made of a copolymer of vinylphosphonic acid and (meth)acrylic acid causes a problem such as restart toning during printing using a synthetic paper containing a certain amount of an antistatic agent on a surface, for example, Yupo® synthetic paper (manufactured by Yopo Corporation). It is believed that reason for restart toning is that the antistatic agent is adsorbed on the interlayer which is made of a vinylphosphonic acid-(meth)acrylic acid copolymer during printing.

Japanese Unexamined Patent Publication (Kokai) No. 07-001853 describes, as a more effect interlayer which imparts stable hydrophilicity to an aluminum substrate and also imparts satisfactory adhesion for a negative working or positive working radiation-sensitive film to be subsequently formed, an interlayer containing a copolymer of 40 to 90 mol % of vinylphosphonic acid and 10 to 60 mol % of acrylamide. It was found that this interlayer solves the problem of tinting, toning or scumming due to poor adhesion of the remaining coating film during development, but does not solve the problem of restart toning, in particular restart toning during printing on a synthetic paper containing an antistatic agent.

PRIOR ART DOCUMENTS

Patent Documents

Patent Document 1: Japanese Unexamined Patent Publication (Kokai) No. 06-340720

Patent Document 2: Japanese Unexamined Patent Publication (Kohyo) (National Publication of Translated Version of PCT Application) No. 2008-511858

Patent Document 3: International Publication No. WO 2005/010613 pamphlet

Patent Document 4: Japanese Unexamined Patent Publication (Kokai) No. 07-001853

DISCLOSURE OF THE INVENTION

Problems to be Solved by the Invention

An object of the present invention is to provide a lithographic printing plate precursor which exhibits satisfactory ink cleanup and restart toning characteristics during printing.

Means for Solving the Problems

The present inventors have achieved the above object and found that a interlayer made of a copolymer which is composed of a unit having a vinylphosphonic acid group and a (meth)acrylamide unit and also has a component proportion ratio of the monomers that has conventionally been known as a preferable component proportion ratio, does not exert the expected effect, and also found that an interlayer including a copolymer, which has the same component of the monomers but employs a component proportion ratio that has never been employed, exhibits satisfactory ink cleanup characteristics, surprisingly, and thus restart toning noticeably decreases.

The present invention provides a lithographic printing plate precursor comprising a substrate having thereon in order an interlayer containing a copolymer comprising K units and L units, and an image-forming layer, wherein
said K unit is derived from a monomer of the formula I:

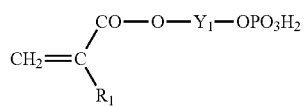

wherein $R^1$ represents a hydrogen atom, a $C_{1-22}$ linear, branched or cyclic alkyl group, a $C_{1-22}$ linear, branched or cyclic, substituted alkyl group, a $C_{6-24}$ aryl group or substituted aryl group, wherein the substituent is selected from a $C_{1-4}$ alkyl group, an aryl group, a halogen atom, a keto group, an ester group, an alkoxy group, or a cyano group; Y represent a single bond, or a $C_{1-22}$ linear, branched or cyclic alkylene; or $CH_2$=$CHPO(OH)_2$; and
said L unit is derived from a monomer of the formula II:

$$CH_2=CRCONH_2 \qquad (II)$$

wherein R is H or $CH_3$, and
said K units are present from more than 3% and less than 40% and said L units are present from more than 60% and less than 97% in the copolymer.

Effects of the Invention

According to the present invention, it is possible to provide a lithographic printing plate precursor which has satisfactory ink cleanup characteristics and satisfactory restart toning recovery properties.

MODE FOR CARRYING OUT THE INVENTION

The term "ink cleanup characteristics" as used herein means that printing is started in a state where an ink is deposited on the entire plate surface and the ink in the non-image area is removed by a fountain solution fed from a fountain roller. Since a plate having excellent ink cleanup characteristics is capable of removing the ink in the non-image area with smaller number of prints, printing paper loss may decrease.

The term "toning" as used herein means stain generated during printing.

The term "restart toning" as used herein means stain at the time of reopening of printing after stopping of printing. In printing sites, after a lithographic printing plate was mounted on a printing press and printing was started, printing is temporarily stopped because of break such as lunch break in the middle of doing work, and then printing is usually reopened in the state where the printing plate is being mounted on the printing press. At the time of reopening, a phenomenon is observed in which ink bleeding occurs around the image printed. This phenomenon is commonly referred to as "restart toning".

The term "scumming" as used herein means greasing which occurs during printing.

<Substrate>

It is possible to use, as a substrate, any substrate which can be used in a photosensitive lithographic printing plate precursor. Examples thereof include metal plates made of aluminum, zinc, copper, stainless steel and iron; plastic films made of polyethylene terephthalate, polycarbonate, polyvinyl acetal and polyethylene; papers obtained by coating a melt-coating a synthetic resin or a synthetic resin solution on papers, and composite materials obtained by forming a metal layer on a plastic film using technologies such as vacuum deposition and lamination; and materials used as the substrate of other printing plates. Of these substrates, aluminum and a composite substrate coated with aluminum are particularly preferred as the substrate of the present invention.

The surface of the aluminum substrate is preferably subjected to a surface treatment for the purpose of enhancing water retentivity and improving adhesion with the interlayer. Examples of the surface treatment include roughening treatments by a brush graining method, a ball graining method, an electrograining method, a chemical graining method, liquid honing and sand blasting, and combinations thereof. Of these surface treatments, a roughening treatment by an electrograining method is particularly preferable.

It is possible to use, as an electrolytic bath in an electrolytic graining treatment, an aqueous solution containing an acid, an alkali or a salt thereof, or an aqueous solution containing an organic solvent. Of these solutions, an electrolytic solution containing hydrochloric acid, nitric acid, or a salt thereof is particularly preferable.

Furthermore, the aluminum substrate subjected to the roughening treatment is optionally subjected to a desmutting treatment using an aqueous solution of an acid or an alkali. It is desired that the aluminum substrate thus obtained is subjected to an anodizing treatment. An anodizing treatment using a bath containing sulfuric acid or phosphoric acid is particularly desired.

<Interlayer>

An interlayer existing between a substrate and an image-forming layer contains a copolymer composed of a K unit and an L unit described below.

The K unit constituting the copolymer is derived from a monomer of the following formula I:

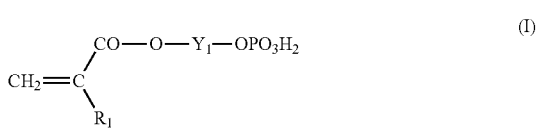

wherein $R_1$ is a hydrogen atom, a $C_{1-22}$ linear, branched or cyclic alkyl group, a $C_{1-22}$ linear, branched or cyclic substituted alkyl group, a $C_{6-24}$ aryl group or a substituted aryl group, the substituent being selected from a $C_{1-4}$alkyl group, an aryl group, a halogen atom, a keto group, an ester group, an alkoxy group, or a cyano group, and $Y_1$ is a single bond, or a $C_{1-22}$ linear, branched or cyclic alkylene, or $CH_2=CHPO(OH)_2$.

Examples of preferable monomer include ethylene glycol acrylate phosphate, ethylene glycol methacrylate phosphate, polyethylene glycol acrylate phosphate, polyethylene glycol methacrylate phosphate, polypropylene glycol acrylate phosphate and polypropylene glycol methacrylate phosphate.

These monomers are commercially available under the trade name of "Phosmer" and have the following structures.

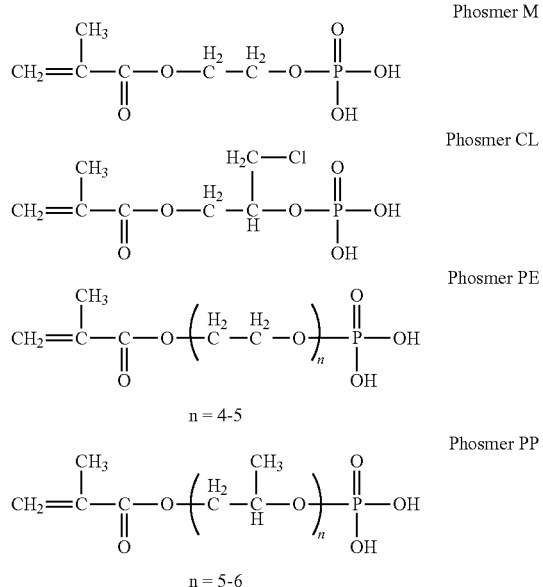

The L unit constituting the copolymer is derived from a monomer of the following formula II:

$$CH_2=CRCONH_2 \quad (II)$$

wherein R is H or $CH_3$.

In the interlayer of the lithographic printing plate precursor of the present invention, the copolymer contains more than 3% and less than 40% of the K unit and more than 60% and less than 97% of the L unit. More preferably, the copolymer contains more than 10% and less than 35% of the K unit and more than 65% and less than 90% of the L unit. When the content of the K unit is 40% or more (that is, L unit is less than 60%), as shown in Examples described hereinafter, the results became inferior in any of a cleanup test and a restart toning test using a coated paper, and a cleanup test using a synthetic paper.

The copolymer usable in the interlayer can optionally include unit components other than the K unit and the L unit. For example, the copolymer can include a unit derived from a monomer having an onium group and a unit derived from a monomer having a sulfonic acid group. When the copolymer includes unit components other than the K unit and the L unit, the amount can be from about 1 to 2%.

Examples of preferable monomer having an onium group include (3-acrylamidepropyl)trimethylammonium chloride, diaryldimethylammonium chloride and methacryloylcholine chloride. Examples of preferable monomer having a sulfonic acid group include arylsulfonic acid, styrenesulfonic acid and 2-acrylamide-2-methylpropanesulfonic acid.

The monomer unit component having an onium group provides the effect of improving adhesion between the image-forming layer and the substrate, while the monomer unit component having a sulfonic acid group provides the effect of improving hydrophilicity of the surface of the substrate.

The interlayer is usually applied on the substrate by dipping the substrate in an aqueous solution of the above copolymer at 20 to 95° C. for 1 to 30 seconds.

It is possible to use, as a method of providing the interlayer on the substrate, various coating methods in addition to the above dip coating method. For example, any of a bar coating method, a spin coating method, a spray coating method and a curtain coating method can be used. The amount of the interlayer applied on the substrate is preferably from 1 to 100 mg/m$^2$, and particularly preferably from 5 to 40 mg/m$^2$, based on dry mass.

The interlayer can contain, in addition to the above copolymer component, for example, inorganic acids such as sulfuric acid and phosphoric acid; organic acids; polymers containing (meth)acrylic acid; and inorganic salts such as aluminum sulfate.

<Image-Forming Layer>

The image-forming layer formed on the interlayer of the lithographic printing plate precursor of the present invention can be a single layer. The image-forming layer can also be a two-layered structure comprising a first image-forming layer and a second image-forming layer formed thereon.

The image-forming layer on the interlayer according to the present invention may be either a negative working or a positive working image-forming layer. The positive working image-forming layer contains a positive working photosensitive composition.

It is preferred to use, as the positive working photosensitive composition, conventionally known positive working photosensitive compositions ((a) to (d)) described below.

(a) A conventionally used positive working photosensitive composition comprising quinonediazide and a novolak resin.

(b) An infrared positive working photosensitive composition containing a resin which is water-insoluble and soluble or dispersible in an aqueous alkali solution, and a photothermal conversion agent, solubility in the aqueous alkali solution increasing by an action of heat.

(c) An infrared positive working photosensitive composition comprising a heat-decomposable sulfonic acid ester polymer or an acid decomposable carboxylic acid ester polymer and an infrared absorber.

(d) A chemically amplified positive working photosensitive composition comprising a combination of an alkali-soluble compound protected with an acid decomposable group, and an acid generator.

It is possible to use, as the negative working photosensitive composition, conventionally known negative working photosensitive compositions ((g) to (l)) described below.

(g) A negative working photosensitive composition comprising a polymer having a photocrosslinkable group, and an azide compound.

(h) A negative working photosensitive composition comprising a diazo compound.

(i) A photo- or thermopolymerizable negative working photosensitive composition comprising a photo- or thermopolymerization initiator, an addition polymerizable unsaturated compound and an alkali-soluble polymer compound.

(j) A negative working photosensitive composition comprising an alkali-soluble polymer compound, an acid generator and an acid-crosslinkable compound.

(k) An on-press developing type negative working image-forming layer composition comprising fine particles of thermoplastic, hydrophobic polymer dispersed therein.

(l) An on-press developing type negative working image-forming layer composition comprising a graft polymer including a hydrophilic segment and a hydrophobic segment, a polymerizable compound and a photothermal conversion agent.

In particular, the lithographic printing plate precursor of the present invention preferably includes an image-forming layer comprising a positive working photosensitive composition. More preferably, a positive working photosensitive lithographic printing plate precursor includes an image-forming layer composed of a first image-forming layer and a second image-forming layer.

One aspect of a two-layered type image-forming layer usable in the lithographic printing plate precursor of the present invention will be described below.

<First Image-Forming Layer>

The first image-forming layer constituting the lithographic printing plate precursor contains a resin which is soluble or dispersible in an aqueous alkali solution.

Since the resin is soluble or dispersible in the aqueous alkali solution, the resin preferably contains at least functional groups such as a hydroxyl group, a carboxyl group, a sulfonic acid group, a phosphoric acid group, an imide group and an amide group. Therefore, the resin soluble or dispersible in the aqueous alkali solution can be suitably produced by polymerizing a monomer mixture containing one or more ethylenically unsaturated monomers having functional groups such as a hydroxyl group, a carboxyl group, a sulfonic acid group, a phosphoric acid group, an imide group, an amide group and a combination thereof.

The ethylenically unsaturated monomer can be a compound represented by the following formula:

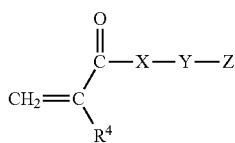

wherein $R^4$ is a hydrogen atom, a $C_{1-22}$ linear, branched or cyclic alkyl group, a $C_{1-22}$ linear, branched or cyclic alkyl group, a $C_{6-24}$ aryl or substituted aryl group, the substituent being selected from a $C_{1-4}$ alkyl group, an aryl group, a halogen atom, a keto group, an ester group, an alkoxy group or a cyano group; X is O, S and $NR^5$, wherein $R^5$ is hydrogen, a $C_{1-22}$ linear, branched or cyclic alkyl group, a $C_{1-22}$ linear, branched or cyclic substituted alkyl group, a $C_{6-24}$ aryl group or a substituted aryl group, a substituent being selected from a $C_{1-4}$ alkyl group, an aryl group, a halogen atom, a keto group, an ester group, an alkoxy group or a cyano group; Y is a single bond, or a $C_{1-22}$ linear, branched or cyclic alkylene, alkyleneoxyalkylene, poly(alkyleneoxy)alkylene or alkylene-NHCONH—; and Z is a hydrogen atom, a hydroxy group, carboxylic acid, —$C_6H_4$—$SO_2NH_2$, —$C_6H_3$—$SO_2NH_2$ (—OH), or a group represented by the following group:

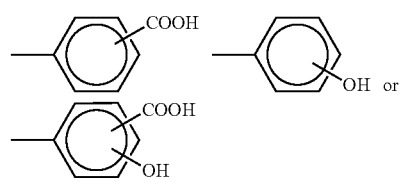

or a mixture thereof.

Examples of the ethylenically unsaturated monomer include, in addition to acrylic acid and methacrylic acid, compounds represented by the following formulas and mixtures thereof.

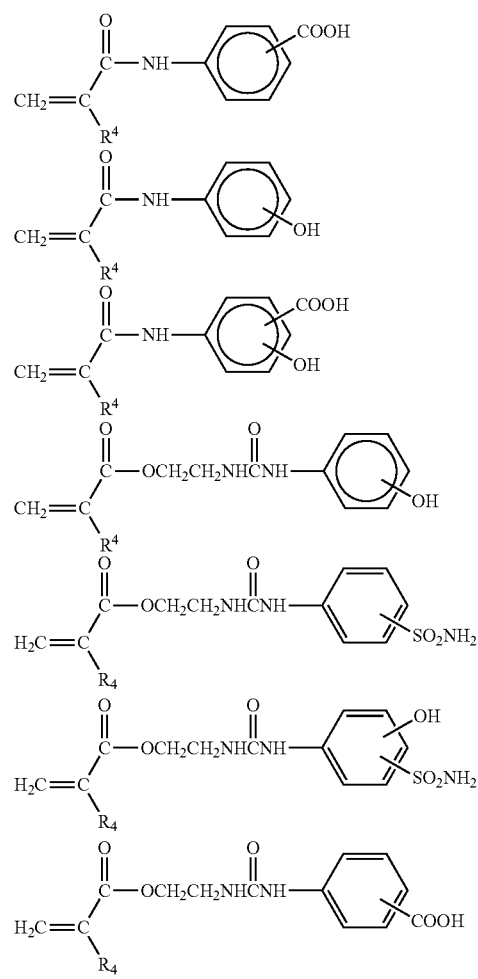

The monomer mixture can contain other ethylenically unsaturated comonomers. Examples of other ethylenically unsaturated comonomers include the following monomers:

acrylic acid esters such as methyl acrylate, ethyl acrylate, propyl acrylate, butyl acrylate, amyl acrylate, ethylhexyl acrylate, octyl acrylate, t-octyl acrylate, chloroethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate and tetrahydroacrylate;

aryl acrylates such as phenyl acrylate and furfuryl acrylate;

methacrylic acid esters such as methyl methacrylate, ethyl methacrylate, propyl methacrylate, isopropyl methacrylate, aryl methacrylate, amyl methacrylate, hexyl methacrylate, cyclohexyl methacrylate, benzyl methacrylate, chlorobenzyl methacrylate, octyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate and tetrahydrofurfuryl methacrylate;

aryl methacrylates such as phenyl methacrylate, cresyl methacrylate and naphthyl methacrylate;

N-alkylacrylamides such as N-methylacrylamide, N-ethylacrylamide, N-propylacrylamide, N-butylacrylamide, N-t-butylacrylamide, N-heptylacrylamide, N-octylacrylamide, N-cyclohexylacrylamide and N-benzylacrylamide;

N-arylacrylamides such as N-phenylacrylamide, N-tolylacrylamide, N-nitrophenylacrylamide, N-naphthylacrylamide and N-hydroxyphenylacrylamide;

N,N-dialkylacrylamides such as N,N-dimethylacrylamide, N,N-diethylacrylamide, N,N-dibutylacrylamide, N,N-diisobutylacrylamide, N,N-diethylhexylacrylamide and N,N-dicyclohexylacrylamide;

N,N-arylacrylamides such as N-methyl-N-phenylacrylamide, N-hydroxyethyl-N-methylacrylamide and N-2-acetoamideethyl-N-acetylacrylamide;

N-alkylmethacrylamides such as N-methylmethacrylamide, N-ethylmethacrylamide, N-propylmethacrylamide, N-butylmethacrylamide, N-t-butylmethacrylamide, N-ethylhexylmethacrylamide, N-hydroxyethylmethacrylamide and N-cyclohexylmethacrylamide;

N-arylmethacrylamides such as N-phenylmethacrylamide and N-naphthylmethacrylamide;

N,N-dialkylmethacrylamides such as N,N-diethylmethacrylamide, N,N-dipropylmethacrylamide and N,N-dibutylmethacrylamide;

N,N-diarylmethacrylamides such as N,N-diphenylmethacrylamide;

methacrylamide derivatives such as N-hydroxyethyl-N-methylmethacrylamide, N-methyl-N-phenylmethacrylamide and N-ethyl-N-phenylmethacrylamide;

allyl compounds such as allyl acetate, allyl caproate, allyl caprylate, allyl laurate, allyl palmitate, allyl stearate, allyl benzoate, allyl acetoacetate, allyl lactate and allyloxyethanol;

vinyl ethers such as hexyl vinyl ether, octyl vinyl ether, dodecyl vinyl ether, ethylhexyl vinyl ether, methoxyethyl vinyl ether, ethoxyethyl vinyl ether, chloroethyl vinyl ether, 1-methyl-2,2-dimethylpropylvinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, tetrahydrofurfuryl vinyl ether, vinylphenyl ether, vinyltolyl ether, vinyl chlorophenyl ether, vinyl-2,4-dichlorophenyl ether, vinyl naphthyl ether and vinyl anthranyl ether;

vinyl esters such as vinyl butyrate, vinyl isobutyrate, vinyl trimethylacetate, vinyl diethylacetate, vinyl valeate, vinyl caproate, vinyl chloroacetate, vinyl methoxyacetate, vinyl butoxyacetate, vinyl phenylacetate, vinyl acetoacetate, vinyl lactate, vinyl-O-phenyl butyrate, vinyl cyclohexylcarboxylate, vinyl benzoate, vinyl salicylate, vinyl chlorobenzoate, vinyl tetrachlorobenzoate and vinyl naphthoate;

styrenes such as styrene, methylstyrene, dimethylstyrene, trimethylstyrene, ethylstyrene, diethylstyrene, isopropylstyrene, butylstyrene, hexylstyrene, cyclohexylstyrene, dodecylstyrene, benzylstyrene, chloromethylstyrene, trifluoromethylstyrene, ethoxymethylstyrene, acetoxymethylstyrene, methoxystyrene, 4-methoxy-3-methylstyrene, dimethoxystyrene, chlorostyrene, dichlorostyrene, trichlorostyrene, tetrachlorostyrene, pentachlorostyrene, bromostyrene, dibromostyrene, iodostyrene, fluorostyrene, 2-bromo-4-trifluoromethylstyrene and 4-fluoro-3-trifluoromethylstyrene;

crotonic acid esters such as butyl crotonate, hexyl crotonate, crotonic acid and glycerin monocrotonate;

dialkyl itaconates such as dimethyl itaconate, diethyl itaconate and butyl itaconate;

dialkyls of maleic acid or fumaric acid, such as dimethyl maleate and dibutyl fumarate;

maleimides such as N-methylmaleimide, N-ethylmaleimide, N-propylmaleimide, N-butylmaleimide, N-phenylmaleimide, N-2-methylphenylmaleimide, N-2,6-diethylphenylmaleimide, N-2-chlorophenylmaleimide, N-cyclohexylmaleimide, N-laurylmaleimide, N-hydroxyphenylmaleimide; and other nitrogen atom-containing monomers such as N-vinyl pyrrolidone, N-vinylpyridine, acrylonitrile and methacrylonitrile.

Of these ethylenically unsaturated comonomers, for example, (meth)acrylic acid esters, (meth)acrylamides, maleimides and (meth)acrylonitriles are preferably used.

The content of the resin soluble or dispersible in the aqueous alkali solution in the first image-forming layer is preferably within a range from 20 to 95% by mass based on the solid content of the layer. When the content of the resin soluble or dispersible in the aqueous alkali solution is less than 20% by mass, such content is disadvantageous in view of chemical resistance. In contrast, when the content is more than 95% by mass, such content is not preferable in view of the exposure speed. If necessary, two or more kinds of resins soluble or dispersible in the aqueous alkali solution may be used in combination.

<Second Image-Forming Layer>

The second image-forming layer constituting the lithographic printing plate precursor of the present invention contains an alkali-soluble resin. The alkali-soluble resin usable in the second image-forming layer is preferably a resin having a carboxylic acid group or an acid anhydride group, and examples thereof include a copolymer obtained by polymerizing an unsaturated carboxylic acid and/or a monomer mixture containing the unsaturated carboxylic anhydride, and polyurethane having a substituent containing an acidic hydrogen atom. Examples of the unsaturated carboxylic acid and/or the unsaturated carboxylic anhydride include acrylic acid, methacrylic acid, maleic acid, maleic anhydride, and itaconic acid and itaconic anhydride. Examples of the copolymerizable ethylenically unsaturated monomer unit include the other ethylenically unsaturated comonomers described above.

In the polyurethane having a substituent containing an acidic hydrogen atom, the acidic hydrogen atom can belong to an acidic functional group such as a carboxyl group, a —$SO_2NHCOO$— group, a —$CONHSO_2$— group, a —$CONHSO_2NH$— group or a —$NHCONHSO_2$— group. However, an acidic hydrogen atom derived from a carboxyl group is particularly preferable.

The polyurethane having an acidic hydrogen atom can be synthesized, for example, by a method of reacting diol having a carboxyl group and, optionally, other diol with diisocyanate; a method of reacting diol, diisocyanate having a carboxyl group and, optionally, other diisocyanate; or a method of reacting diol having a carboxyl group and, optionally, other diol with diisocyanate having a carboxyl group and, optionally, other diisocyanate.

Examples of the diol having a carboxyl group include 3,5-dihydroxybenzoic acid, 2,2-bis(hydroxymethyl)propionic acid, 2,2-bis(hydroxyethyl)propionic acid, 2,2-bis(3-hydroxypropyl)propionic acid, 2,2-bis(hydroxymethyl)acetic acid, bis-(4-hydroxyphenyl)acetic acid, 4,4-bis-(4-hydroxyphenyl)pentanoic acid and tartaric acid. In particular, 2,2-bis(hydroxymethyl)propionic acid is more preferably in view of reactivity with isocyanate.

Examples of the other diol include dimethylolpropane, polypropylene glycol, neopentyl glycol, 1,3-propanediol, polytetramethylene ether glycol, polyesterpolyol, polymerpolyol, polycaprolactone polyol, polycarbonatediol, 1,4-butanediol, 1,5-pentadiol, 1,6-hexanediol and polybutadiene polyol.

Examples of the diisocyanate having a carboxyl group include dimmer acid diisocyanate.

Examples of the other diisocyanate include 4,4-diphenylmethane diisocyanate, xylylene diisocyanate, naphthylene-1,5-diisocyanate, tetramethylxylene diisocyanate, hexamethylene diisocyanate, toluene-2,4-diisocyanate, isophorone diisocyanate, hydrogenated xylylene diisocyanate, dicyclohexylmethane diisocyanate, norbornene diisocyanate and trimethylhexamethylene diisocyanate.

A molar ratio of the diisocyanate to the diol is preferably from 0.7:1 to 1.5:1. When an isocyanate group remains at the polymer end, polyurethane can be finally synthesized without remaining of the isocyanate group by treating with alcohols or amines.

A weight average molecular weight of the copolymer including an unsaturated carboxylic acid unit and/or an unsaturated carboxylic anhydride unit is preferably within a range from 800 to 10,000. When the weight average molecular weight of the copolymer including an unsaturated carboxylic acid unit and/or an unsaturated carboxylic anhydride unit is less than 800, the image area obtained by forming images is weak and tends to be inferior in developing solution resistance. In contrast, when the weight average molecular weight of the copolymer including an unsaturated carboxylic anhydride unit is more than 10,000, sensitivity tends to be inferior.

The weight average molecular weight of the polyurethane having a substituent containing an acidic hydrogen atom is preferably within a range from 2,000 to 100,000. When the weight average molecular weight of the polyurethane is less than 2,000, the image area obtained by forming images is weak and tends to be inferior in press life. In contrast, when the weight average molecular weight of the polyurethane is more than 100,000, sensitivity tends to be inferior.

The content of the copolymer including an unsaturated carboxylic acid unit and/or an unsaturated carboxylic anhydride unit in the second image-forming layer is preferably within a range from 10 to 100% by mass based on the solid content of the layer. When the content of the copolymer including an unsaturated carboxylic acid unit and/or an unsaturated carboxylic anhydride unit is less than 10% by mass, such content is disadvantageous in view of developing solution resistance and is not preferred.

In contrast, the content of the copolymer including an unsaturated carboxylic acid unit and/or an unsaturated carboxylic anhydride unit or the content of the polyurethane having a substituent containing an acidic hydrogen atom is preferably within a range from 2 to 90% by mass based on the solid content of the layer. When the content of the polyurethane having a substituent containing an acidic hydrogen atom is less than 2% by mass, such content is disadvantageous in view of the developing speed. In contrast, when the content is more than 90% by mass, such content is not preferred in view of storage stability. If necessary, two or more kinds of polyurethanes having a substituent containing an acidic hydrogen atom may also be used in combination. Furthermore, two or more kinds of copolymers including an unsaturated carboxylic anhydride unit, copolymers including an unsaturated carboxylic acid unit or polyurethanes having a substituent containing an acidic hydrogen atom may be used in combination.

<Photothermal Conversion Material>

The image-forming layer can contain a photothermal conversion material. The photothermal conversion material means any substance capable of converting electromagnetic wave into heat energy, and is a substance having a maximum absorption wavelength within a near infrared or infrared range, specifically a substance having a maximum absorption wavelength within a range from 760 nm to 1,200 nm. Examples of the substance include various pigments or dyes.

Examples of the pigments used in the invention include commercially available pigments and the pigments described in Color Index Handbook, "Latest Pigment Handbook" (Japan Society of pigment technologies Ed., 1977), "Latest Pigment Application Technologies" (CMC Publishing Co., Ltd., 1986), and "Printing Ink Technologies" (CMC Publishing Co., Ltd., 1984). Examples of the pigments include black pigments, yellow pigments, orange pigments, brown pigments, red pigments, purple pigments, blue pigments, green pigments, fluorescent pigments, as well as polymer-bound colorants. Specific examples thereof include insoluble azo pigments, azolake pigments, condensation azo pigments, chelate azo pigments, phthalocyanine-based pigments, anthraquinone-based pigments, perylene-based and perynone-based pigments, thioindigo-based pigments, quinacridone-based pigments, dioxazine-based pigments, isoindolinone-based pigments, quinophtharone-based pigments, dyed lake-based pigments, azine pigments, nitroso pigments, nitro pigments, natural pigments, fluorescent pigments, inorganic pigments and carbon black.

Of these pigments, carbon black is preferably used as a substance which efficiently absorbs light within a near infrared or infrared range and is economical. As these carbon blacks, grafted carbon blacks, which have various functional groups and are excellent in dispersibility, are commercially available and are described on page 167 of "Carbon Black Handbook, Third Edition" (edited by the Association of Carbon Black, 1995) and page 111 of "Characteristics and Optimum Formulation of Carbon Black and Application Technique" (edited by the Association of Technical Information, 1997), and any of these carbon blacks can be preferably used in the present invention.

These pigments may be used without being surface-treated or may be used after being subjected to known surface treatments. The known surface treatments include a treatment wherein a resin or a wax is applied on the surface of the pigments, a treatment wherein a surface active agent is adhered to the surface of the pigments, and a treatment wherein a reactive substance such as a silane coupling agent, an epoxy compound or a polyisocyanate is bonded to the surface of the pigments. These surface-treating methods are described in "Properties and Applications of Metal Soaps" (Saiwai Shobo K. K.), "Latest Pigment Application Technologies" (CMC, published 1986), and "Printing Ink Technologies" (CMC, published 1984). The particle diameter of the pigments used in the present invention is preferably within a range from 0.01 to 15 μm, and more preferably from 0.01 to 5 μm.

The dyes used in the present invention are conventionally known dyes and described, for example, in "Dye Handbook" (edited by the Association of Organic Synthesis Chemistry, published 1970), "Handbook of Color Material Engineering" (edited by the Japan Society of Color Material, Asakura Shoten K. K., published 1989), "Technologies and Markets of Industrial Dyes" (CMC, published 1983), and "Chemical Handbook, Applied Chemistry Edition" (edited by The Chemical Society of Japan, Maruzen Shoten K. K., published 1986). Specific examples of the dyes include azo dyes, azo dyes in the form of metal complex salts, pyrazolone azo dyes, anthraquinone dyes, phthalocyanine dyes, carbonium dyes, quinonimine dyes, methine dyes, cyanine dyes, indigo dyes, quinoline dyes, nitro-based dyes, xanthene dyes, thiazine-based dyes, azine dyes, and oxazine dyes.

It is possible to use, as the dyes which absorb light within a near infrared or infrared range are, for example, azo dyes, azo dyes in the form of metal complex salts, pyrazolone azo dyes, anthraquinone dyes, phthalocyanine dyes, carbonium dyes, quinonimine dyes, methine dyes, cyanine dyes, squalirium dyes, pyrylium salts and metal thiolates complexes (for example, nickel chiolate compelx). Of these dyes, cyanine dyes are preferable and examples thereof include a cyanine dye represented by the general formula (1) disclosed in Japanese Unexamined Patent Publication (Kokai) No. 2001-305722, and compounds disclosed in paragraphs [0096] to [0103] of Japanese Unexamined Patent Publication (Kokai) No. 2002-079772.

The photothermal conversion materials are particularly preferably dyes having the following formulas:

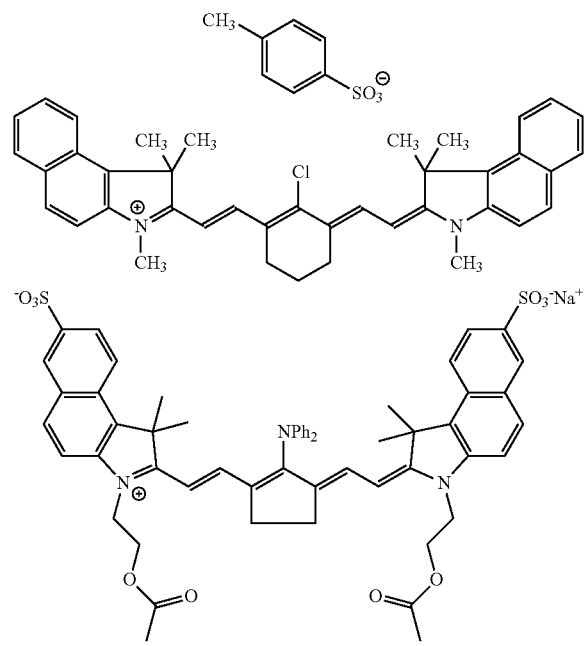

wherein Ph represents a phenyl group.

The photothermal conversion material can be added in the image-forming layer in the proportion of 0.01 to 50% by mass, preferably 0.1 to 25% by mass, and particularly preferably 1 to 20% by mass, based on the first and/or second image-forming layer. When the additive amount is less than 0.01% by mass, sensitivity may decrease. In contrast, when the additive amount is more than 50% by mass, stain may generate in the image-area during printing. These photothermal conversion materials may be used alone, or two or more kinds of them may be used in combination.

The lithographic printing plate precursor of the present invention is produced by sequentially applying solutions or dispersions prepared by dissolving or dispersing constituent components of an image-forming layer in an organic solvent on a substrate, followed by drying to form the image-forming layer on the substrate.

It is possible to use, as the organic solvent in which constituent components of the image-forming layer are dissolved or dispersed, any of conventionally known organic solvents. Of these organic solvents, those having a boiling point within a range from 40° C. to 220° C., and particularly from 60° C. to 160° C. are selected in view of advantage upon drying.

Examples of the organic solvent include alcohols such as methyl alcohol, ethyl alcohol, n- or iso-propyl alcohol, n- or iso-butyl alcohol and diacetone alcohol; ketones such as acetone, methyl ethyl ketone, methyl propyl ketone, methyl butyl ketone, methyl amyl ketone, methyl hexyl ketone, diethylketone, diisobutylketone, cyclohexanone, methylcyclohexanone and acetylacetone; hydrocarbons such as hexane, cyclohexane, heptane, octane, nonane, decane, benzene, toluene, xylene and methoxybenzene; acetic acid esters such as ethyl acetate, n- or iso-propyl acetate, n- or iso-butyl acetate, ethylbutyl acetate and hexyl acetate; halides such as methylene dichloride, ethylene dichloride and monochloroebenzene; ethers such as isopropylether, n-butylether, dioxane, dimethyldioxane and tetrahydrofuran; polyhydric alcohols and derivatives thereof, such as ethylene glycol, ethylene glycol monomethyl ether, ethylene glycol monomethyl ether acetate, ethylene glycol monoethyl ether, ethylene glycol monoethyl ether acetate, ethylene glycol monobutyl ether, ethylene glycol monobutyl ether acetate, ethylene glycol dimethyl ether, ethylene glycol diethyl ether, ethylene glycol dibutyl ether, methoxyethoxyethanol, diethylene glycol monomethyl ether, diethylene glycol dimethyl ether, diethylene glycol methyl ethyl ether, diethylene glycol diethyl ether, propylene glycol, propylene glycol monomethyl ether, propylene glycol monomethyl ether acetate, propylene glycol monoethyl ether, propylene glycol monoethyl ether acetate, propylene glycol monobutyl ether, 3-methyl-3-methoxybutanol and 1-methoxy-2-propanol; and special solvents such as dimethyl sulfoxide, N,N-dimethylformamide, methyl lactate and ethyl lactate. These organic solvents may be used alone, or in combination. It is suitable that the concentration of solid components in the solution or dispersion to be applied is adjusted within a range from 2 to 50% by mass. The term "solid components" as used herein mean components excluding the organic solvent.

It is possible to use, as the coating method of the solution or dispersion of constituent components of the image-forming layer, for examples, a roll coating method, a dip coating method, an air knife coating method, a gravure coating method, a gravure offset coating method, a hopper coating method, a blade coating method, a wire doctor coating method, a spray coating method and a die coating method. The coating weight is preferably within a range from 10 ml/m² to 100 ml/m².

The solution or dispersion applied on the substrate is usually dried by heated air. The drying temperature (the temperature of heated air) is preferably from 30° C. to 220° C., and particularly preferably from 40° C. to 160° C. As the drying method, not only a method of maintaining the drying temperature at a given temperature during drying, but also a method of stepwisely raising the drying temperature can be carried out.

Preferable results are sometimes obtained by dehumidifying dry air. It is suitable to supply heated air to the surface to be coated at a rate of 0.1 m/seconds to 30 m/seconds, and particularly 0.5 m/seconds to 20 m/seconds.

Usually, each coating weight of the image-forming layer is from about 0.1 to about 5 g/m² based on dry mass.

<Other Constituent Components of Image-Forming Layer>

It is possible to optionally add known additive, for example, colorants (dyes, pigments), surfactants, plasticizers, stability improvers, development promoters, development inhibitors and lubricants (silicon powder, etc.) to the image-forming layer of the lithographic printing plate precursor of the present invention.

Examples of suitable dye include basic oil-soluble dyes such as Crystal Violet, Malachite Green, Victoria Blue, Methylene Blue, Ethyl Violet and Rhodamine B. Examples of commercially available products include "Victoria Pure Blue BOH" (manufactured by HODOGAYA CHEMICAL CO., LTD.), "Oil Blue #603" (manufactured by ORIENT CHEMICAL INDUSTRIES CO., LTD.), "VPS-Naps (a naphthalenesulfonic acid salt of Victoria Pure Blue)" (manufactured by HODOGAYA CHEMICAL CO., LTD.) and "D11" (manufactured by PCAS). Examples of the pigment include Phthalocyanine Blue, Phthalocyanine Green, Dioxadine Violet and Quinacridone Red.

Examples of the surfactant include fluorine-based surfactants and silicone-based surfactants.

Examples of the plasticizer include diethyl phthalate, dibutyl phthalate, dioctyl phthalate, tributyl phosphate, trioctyl phosphate, tricresyl phosphate, tri(2-chloroethyl) phosphate and tributyl citrate.

As known stability improvers, for example, phosphoric acid, phosphorous acid, oxalic acid, tartaric acid, malic acid, citric acid, dipicolinic acid, polyacrylic acid, benzenesulfonic acid and toluenesulfonic acid can also be used in combination.

Examples of the other stability improver include known phenolic compounds, quinones, N-oxide compounds, amine-based compounds, sulfide group-containing compounds, nitro group-containing compounds and transition metal compounds. Specific examples thereof include hydroquinone, p-methoxyphenol, p-creresol, pyrogallol, t-butyl catechol, benzoquinone, 4,4'-thiobis(3-methyl-6-t-butylphenol), 2,2'-methylenebis(4-methyl-6-t-butylphenol), 2-mercaptobenzimidazole and an N-nitrosophenylhydroxyamine primary cerium salt.

Examples of the development promoters include acid anhydrides, phenols and organic acids. The acid anhydrides are preferably cyclic anhydrides. Specifically, it is possible to use, as the cyclic anhydride, phthalic anhydride, tetrahydrophthalic anhydride, hexahydrophthalic anhydride, 3,6-endooxy-tetrahydrophthalic anhydride, tetrachlorophthalic anhydride, maleic anhydride, chloromaleic anhydride, α-phenyl maleic anhydride, succinic anhydride and pyromellitic anhydride described in the specification of U.S. Pat. No. 4,115,128. Examples of the noncyclic acid include acetic anhydrides. Examples of the phenols include bisphenol A, 2,2'-bishydroxysulfone, p-nitrophenol, p-ethoxyphenol, 2,4,4'-trihydroxybenzophenone, 2,3,4-trihydroxybenzophenone, 4-hydroxybenzophenone, 4,4',4''-trihydroxytriphenylmethane and 4,4',3'',4''-tetrahydroxy-3,5,3',5'-tetramethyltriphenylmethan.

Examples of the organic acids include sulfonic acids, sulfonic acids, alkylsulfuric acids, phosphoric acids, phosphoric acid esters and carboxylic acids described in Japanese Unexamined Patent Publication (Kokai) No. 60-88942 and Japanese Unexamined Patent Publication (Kokai) No. 2-96755, and specific examples thereof include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid and ascorbic acid.

The development inhibitor is not particularly limited as long as it forms an interaction with the alkali-soluble resin, substantially decreases solubility in a developing solution of the alkali-soluble resin in the non-exposed area, and also lowers the interaction in the exposed area and thus it becomes soluble in the developing solution. In particular, a quaternary ammonium salt and a polyethylene glycol-based compound are preferably used. There are compounds which function as the development inhibitor among the infrared absorbers and colorants descried above, and they are also preferably exemplified. In the case of onium salts, o-quinonediazide compounds, aromatic sulfone compounds and aromatic sulfonic acid ester compounds, which are heat-decomposable and are also in the state where they are not decomposed, substances capable of substantially decreasing solubility of the alkali-soluble resin are also exemplified.

The amount of these various additives varies depending on the purposes. Usually, the amount is preferably within a range from 0 to 30% by mass based on the solid components of the image-forming layer.

In the image-forming layer of the lithographic printing plate precursor of the present invention, if necessary, other alkali-soluble or dispersible resins can also be used in combination. Examples of the other alkali-soluble or dispersible resin include copolymers of alkali-soluble group-containing monomers such as acrylic acid, methacrylic acid, maleic acid, maleic anhydride, itaconic acid and itaconic anhydride with other monomers, polyester resins and acetal resins.

The lithographic printing plate precursor of the present invention may contain a matting agent in the image-forming layer for the purpose of improving joined paper peelability and improving plate transport properties of an automatic plate feeding apparatus. In order to prevent the surface of an original plate from scratching, a protective layer may be provided on the image-forming layer and the protective layer may contain the matting agent.

<Exposure and Development>

The infrared-sensitive or heat-sensitive lithographic printing plate precursor of the present invention can be preferably used as a so-called computer-to-plate (CTP) plate capable of directly writing images on a plate, based on digital image information from a computer, using a laser.

As a laser light source used in the present invention, a high-output laser having a maximum intensity within a near infrared or infrared range is used most preferably. Examples of the high-output laser having a maximum intensity within a near infrared or infrared range include various lasers having a maximum intensity within a near infrared or infrared range from 760 nm to 1,200 nm, for example, a semiconductor laser and YAG laser.

The positive working lithographic printing plate precursor of the present invention is formed with images by an image forming method in which images are written in an image-forming layer using laser light and the images are developed to remove the non-image area using a wet developing method. That is, according to the image forming method of the present invention, images are formed by the step of imagewise exposing a lithographic printing plate precursor of the present invention, and the step of developing the exposed lithographic printing plate precursor to remove the exposed area, thus forming the image area composed of an image-forming layer and the non-image area.

Examples of the developing solution used in the developing include an aqueous alkali solution (basic aqueous solution). The pH of the aqueous alkali solution used in the positive working lithographic printing plate precursor of the present invention is preferably low pH (pH 12 or less). Specifically, the ph is preferably from 7 to 12, more preferably from 8 to 12, and particularly preferably from 10 to 12.

Examples of the alkali agent used in the developing solution include inorganic alkali compounds such as potassium hydroxide, sodium hydroxide, lithium hydroxide, a sodium, potassium or ammonium salt of secondary or tertiary phosphoric acid, sodium metasilicate, sodium carbonate and ammonia; and organic alkali compounds such as monomethylamine, dimethylamine, trimethylamine, monoethylamine, diethylamine, triethylamine, monoisopropylamine, diisopropylamine, n-butylamine, di-n-butylamine, monoethanolamine, diethanolamine, triethanolamine, ethyleneimine and ethylenediamine.

The content in the alkali agent in the developing solution is preferably within a range from 0.005 to 10% by mass, and particularly preferably from 0.05 to 5% by mass, based on the total mass of the developing solution. When the content of the alkali agent in the developing solution is less than 0.005% by mass, poor development tends to result. In contrast, when the content is more than 10% by mass, an adverse influence such as erosion of the image area during the development is likely to be exerted. Therefore, it is not preferred.

It is also possible to add an organic solvent to the developing solution. Examples of the organic solvent, which can be added to the developing solution, include ethyl acetate, butyl acetate, amyl acetate, benzyl acetate, ethylene glycol monobutyl acetate, butyl lactate, butyl levulinate, methyl ethyl ketone, ethyl butyl ketone, methyl isobutyl ketone, cyclohexanone, ethylene glycol monobutyl ether, ethylene glycol monobenzyl ether, ethylene glycol monophenyl ether, benzyl alcohol, methyl phenyl carbitol, n-amyl alcohol, methyl amyl alcohol, xylene, methylene dichloride, ethylene dichloride and monochlorobenzene. When the organic solvent is added to the developing solution, the additive amount of the organic solvent is preferably 20% by mass or less, and particularly preferably 10% by mass or less, based on the total mass of the developing solution.

It is also possible to optionally add, in the developing solution, water-soluble sulfurous acid salts such as lithium sulfite, sodium sulfite, potassium sulfite and magnesium sulfite; hydroxyaromatic compounds such as alkali-soluble pyrazolone compounds, alkali-soluble thiol compounds and methylresolcine; water softeners such as polyphosphoric acid salts and aminopolycarboxylic acids; various surfactants, for example, anionic surfactants such as sodium isopropylnaphthalene sulfonate, sodium n-butylnaphthalene sulfonate, sodium N-methyl-N-pentadecylaminoacetate and sodium lauryl sulfate, nonionic surfactants, cationic surfactants, amphoteric surfactants and fluorine-based surfactants; and various defoamers.

The temperature of the developing solution is preferably within a range from 15 to 40° C., and the dipping time is preferably within a range from 1 to 120 seconds. If necessary, the surface can also be slightly rubbed during the development.

The developed lithographic printing plate may be treated with a plate surface protective agent after washing with water, but the treatment is optionally conducted. The treatment with the plate surface protective agent is a so-called desensitizing treatment and is conducted for the purpose of protecting the non-image area, preventing printing stains and protecting from scratching.

It is preferred to add a water-soluble polymer compound having film-forming properties to the plate surface protective agent. Examples of the water-soluble polymer compound include acasia, cellulose derivatives (for example, carboxymethyl cellulose, carboxyethyl cellulose, methyl cellulose, hydroxypropyl cellulose, etc.) and modified products thereof, polyvinyl alcohol and a derivative thereof, polyvinyl pyrrolidone, polyacrylamide and a copolymer thereof, vinylmethyl ether/maleic anhydride copolymer, vinyl acetate/maleic anhydride copolymer, styrene/maleic anhydride copolymer, water-soluble soybean polysaccharides, starch derivatives (for example, dextrin, enzymatically hydrolyzed dextrin, hydroxypropylated diastase-hydrolyzed dextrin, carboxydimethylated starch, phosphated starch, Cyclo® dextrin), pullulan and pullulan derivatives, and hemicellulose extracted from soybean. The content of these water-soluble polymers is preferably from 0.1 to 30% by mass, and particularly preferably from 1 to 20% by mass, based on the total amount of the plate surface protective agent.

The plate surface protective agent may contain a surfactant. The surfactant is preferably a nonionic surfactant or cationic surfactant which is less likely to form an interaction with an onium group in the starch.

Examples of the nonionic surfactant include polyoxyethylene alkyl ethers, polyoxyethylene alkyl phenyl ethers, polyoxyethylene polystyryl phenyl ether, polyoxyethylene polyoxypropylene alkyl ether, glycerin fatty acid partial esters, sorbitan fatty acid partial esters, pentaerythritol fatty acid partial esters, propylene glycol monofatty acid ester, sucrose fatty acid partial ester, polyoxyethylene sorbitan fatty acid partial esters; polyoxyethylene sorbitol fatty acid partial esters, polyethylene glycol fatty acid esters, polyglycerinfatty acid partial esters, polyoxyethylenated castor oil, polyoxyethylene glycerin fatty acid partial esters, fatty acid, diethanolamides, N,N-bis-2-hydroxyalkylamines, polyoxyethyleneakylamine, triethanolamine fatty acid ester, trialkylamine oxide, polypropylene glycol having a molecular weight of 200 to 5,000, trimethylolpropane, adduct of polyoxyethylene or polyoxypropylene of glycerin or sorbitol, and acetylene glycol-based surfactants.

Examples of the cationic surfactant include quaternary ammonium salts such as trimethylbenzylammonium chloride. The anionic surfactant is useful for improvement of inking properties or coater coatability. Examples of specific compound of anionic surfactant, which can be used in the present invention, include fatty acid salts, abietic acid salts, hydroxyalkanesulfonic acid salts, alkanesulfonic acid salts, dialkylsulfosuccinic salts, linear alkylbenzenesulfonic acid salts, branched alkylbenzenesulfonic acid salts, alkylnaphthalenesulfonic acid salts, alkylphenoxypolyoxyethylenepropylsulfonic acid salts, polyoxyethylenealkylsulfophenyl ether salts, sodium N-methyl-N-oleyltaurine, disodium N-alkylsulfosuccinic monoamides, petroleum sulfonic acid salts, sulfonated castor oil, sulfonated beef tallow, sulfuric acid ester salts of fatty acid alkyl ester, alkylsulfuric acid ester salts, polyoxyethylenealkyl ether sulfuric acid ester salts, fatty acid monoglycride sulfuric acid ester salts, polyoxyethylene alkyl phenyl ethers sulfuric acid ester salts, polyoxyethylene styryl phenyl ether sulfuric acid ester salts, alkyl phosphoric acid ester salts, polyoxyethylene alkyl ether phosphoric acid ester salts, polyoxyethylene alkyl phenyl ether phosphoric acid ester salts, partially saponified product of a styrene-maleic anhydride copolymer, partially saponified products an olefin-maleic anhydride copolymer, and naphthalenesulfonic acid salt formalin condensates. Two or more kinds of these surfactants can be used in combination. The amount of the surfactant to be used is preferably from 0.01 to 20% by mass, and particularly preferably from 0.1 to 10% by mass, based on the total amount of the plate surface protective agent.

In order to improve inking properties of the image area, an organic solvent may be further added to the plate surface protective agent. Examples of the solvent include alcohols, ketones, esters and polyhydric alcohols.

Examples of the alcohols include n-hexanol, 2-ethylbutanol, n-heptanol, 2-heptanol, 3-heptanol, 2-octanol, 2-ethylhexanol, 3,5,5-trimethylhexanol, nonanol, n-decanol, undecanol, n-dodecanol, tetradecanol, heptadecanol, trimethylnonyl alcohol, cyclohexanol, benzyl alcohol and tetrahydrofurfuryl alcohol.

Examples of the ketones include methyl n-amyl ketone, methyl n-hexyl ketone, ethyl n-butyl ketone, di-n-propyl ketone, diacetone alcohol and cyclohexanone.

Examples of the esters include n-amyl acetate, isoamyl acetate, methylisoamyl acetate, methoxybutyl acetate, benzyl acetate, ethyl lactate, butyl lactate, n-amyl lactate, methyl benzoate, ethyl benzoate, dimethyl phthalate, diethyl phthalate, dibutyl phthalate, di-2-ethylhexyl phthalate and dioctyl phthalate.

Examples of the polyhydric alcohols and derivatives thereof include ethylene glycol, ethylene glycol monomethyl ether acetate, ethylene glycol monoethyl ether acetate, ethylene glycol butyl ether, ethylene glycol dibutyl ether, ethylene glycol isoamyl ether, ethylene glycol monophenyl ether, ethylene glycol monophenyl ether acetate, ethylene glycol benzyl ether, ethylene glycol monohexyl ether, methoxyethanol, diethylene glycol, diethylene glycol monomethyl ether, diethylene glycol monoethyl ether, diethylene glycol monobutyl ether, diethylene glycol monobutyl ether acetate, diethylene glycol dimethyl ether, diethylene glycol diethyl ether, diethylene glycol dibutyl ether, triethylene glycol, triethylene glycol monomethyl ether, triethylene glycol monoethyl ether, tetraethylene glycol, polyethylene glycol, propylene glycol, dipropylene glycol, propylene glycol monoethyl ether, propylene glycol monobutyl ether, 1-butoxyethoxypropanol, dipropylene glycol, dipropylene glycol monomethyl ether, dipropylene glycol monoethyl ether, tripropylene glycol monomethyl ether, tripropylene glycol monobutyl ether, octylene glycol, 2-ethyl-1,3-hexanediol, 1,6-hexanediol, 2,5-hexanediol, 3,4-hexanediol, 1,8-octanediol, 1,9-nonanediol, 1,10-decanediol, glycerin, glycerin monoacetate, glycerin triacetates and sorbitol.

For the purpose of pH adjustment and hydrophilization, an acid may be added to the plate surface protective agent. Examples of the mineral acid include phosphoric acid, nitric acid and sulfuric acid. Examples of the organic acid include citric acid, acetic acid, oxalic acid, phosphonic acid, malonic acid, p-toluenesulfonic acid, tartaric acid, malic acid, lactic acid, levulinic acid, phytic acid, organic phosphonic acid, tannic acid and silicic acid. Examples of the inorganic salt include magnesium nitrate and nickel sulfate. Mineral acids, organic acids or inorganic salts may be used alone, or two or more kinds of them may be used in combination. The additive amount is preferably from 0.1 to 10% by mass based on the total amount of the plate surface protective agent.

In addition to the components described above, a chelating agent may be optionally added to the plate surface protective agent. Usually, the plate surface protective agent is commercially available in the form of a concentrated solution and is diluted by adding tap water or well water before use. Since calcium ions contained in tap water or well water used for dilution may exert an adverse influence on printing and thus print copies are easily stained, the above problem can be solved by adding the chelate compound.

Examples of the chelating agent include acids such as ethylenediaminetetraacetic acid, diethylenetriaminepentaacetic acid, triethylenetetraminehexaacetic acid, hydroxyethylethylenediaminetriacetic acid, nitrilotriacetic acid, 1-hydroxyethane-1,1-diphosphonic acid, aminotri(methylenephosphonic acid), ethylenediaminetetra(methylenephosphonic acid), diethylenetriaminepenta(methylenephosphonic acid), triethylenetetraminehexa(methylenephosphonic acid) and hydroxyethylethylenediaminetri(methylenephosphonic acid), and potassium, sodium and amine salts thereof. These chelating agents are selected from those which stably exist in the composition of the plate surface protective agent and do not inhibit printability. The additive amount is preferably from 0.01 to 10% by mass based on the total amount of the plate surface protective agent when used.

In addition, additives such as an antiseptic and a defoamer may be added to the plate surface protective agent. Examples of the antiseptic include phenol or derivatives thereof, formalin, phenolformalin, imidazole derivatives, sodium dehydroacetate, 4-isothiazolin-3-one derivatives, benzointhiazolin-3-one, benztriazole derivatives, amidineguanidine derivatives, quaternary ammonium salts, derivatives of pyridine, quinoline and guanidine, dieazine, triazole derivatives, oxazole, oxazine derivatives, nitroalcohol derivatives, and benzoic acid or derivatives thereof. The additive amount is preferably the amount which stably exerts the effect against bacteria, molds and yeasts. The amount varies depending on the kinds of bacteria, molds and yeasts, and is preferably within a range from 0.001 to 1% by mass based on the total amount of the plate surface protective agent. Two or more kinds of antiseptics are preferably used in combination so as to exert the effect against various molds and bacteria. The defoamer is preferably a silicone-based defoamer. Of these deformers, any of emulsion/dispersion type and solubilized deformers can be used. The additive amount is preferably from 0.001 to 1% by mass based on the total amount of the plate surface protective agent. After treating with the plate surface protective agent, the lithographic printing plate is dried and used for printing as a printing plate.

EXAMPLES

The present invention will be described in more detail, as one aspect, by way of Examples of a lithographic printing plate including a positive working image-forming layer. However, the present invention is not limited by the following Examples. As a matter of course, the present invention can be a lithographic printing plate precursor having a negative working image-forming layer as another aspect.

Synthesis Examples of Water-Soluble Copolymer for Coating of Interlayer

Synthesis Example 1

Vinylphosphonic Acid/Acrylamide Copolymer (Molar Ratio of 1:9) (I-1)

In a 10 liter flask equipped with a stirrer, a capacitor and a dropping device, 3,500 g of ethanol was changed and heated to 70° C. Then, 231.1 g (2.14 mol) of a vinylphosphonic acid monomer, 1368.9 g (19.26 mol) of acrylamide and 52 g of AIBN were dissolved in 1,000 g of ethanol and the obtained solution was added dropwise in a reactor over 4 hours. During the dropwise addition of a monomer solution, a white precipitate was produced. After heating and stirring for 2 hours while maintaining at 70° C., heating was stopped and the reaction solution was cooled to room temperature. The precipitate thus produced was collected by filtration under reduced pressure and then washed with 1,000 g of ethanol. The precipitate was vacuum-dried at 40° C. for 24 hours to obtain a white fine crystal. Yield: 1,550 g Synthesis Example 2

Vinylphosphonic Acid/Acrylamide Copolymer (Molar Ratio of 2:8) (I-2)

In a 10 liter flask equipped with a stirrer, a capacitor and a dropping device, 3,500 g of ethanol was charged and heated to 70° C. Then, 440.5 g (4.08 mol) of a vinylphosphonic acid monomer, 1159.5 g (16.31 mol) of acrylamide and 52 g of AIBN were dissolved in 1,000 g of ethanol and the obtained solution was added dropwise in a reactor over 4 hours. During the dropwise addition of a monomer solution, a white precipitate was produced. After heating and stirring for 2 hours while maintaining at 70° C., heating was stopped and the reaction solution was cooled to room temperature. The precipitate thus produced was collected by filtration under reduced pressure and then washed with 1,000 g of ethanol. The precipitate was vacuum-dried at 40° C. for 24 hours to obtain a white fine crystal. Yield: 1,550 g Synthesis Example 3

Vinylphosphonic Acid/Acrylamide Copolymer (Molar Ratio of 35:65) (I-3)

In a 10 liter flask equipped with a stirrer, a capacitor and a dropping device, 3,500 g of ethanol was charged and heated to 70° C. Then, 720 g (6.67 mol) of a vinylphosphonic acid monomer, 880 g (12.38 mol) of acrylamide and 52 g of AIBN were dissolved in 1,000 g of ethanol and the obtained solution was added dropwise in a reactor over 4 hours. During the dropwise addition of a monomer solution, a white precipitate was produced. After heating and stirring for 2 hours while maintaining at 70° C., heating was stopped and the reaction solution was cooled to room temperature. The precipitate thus produced was collected by filtration under reduced pressure and then washed with 1,000 g of ethanol. The precipitate was vacuum-dried at 40° C. for 24 hours to obtain a white fine crystal. Yield: 1,550 g Synthesis Example 4

Phosmer M/Acrylamide Copolymer (Molar Ratio of 2:8) (I-4)

In a 10 liter flask equipped with a stirrer, a capacitor and a dropping device, 3,500 g of ethanol was charged and heated to 70° C. Then, 679.7 g (3.23 mol) of Phosmer M, 920.3 g (12.95 mol) of acrylamide and 52 g of AIBN were dissolved in 1,000 g of ethanol and the obtained solution was added dropwise in a reactor over 4 hours. During the dropwise addition of a monomer solution, a white precipitate was produced. After heating and stirring for 2 hours while maintaining at 70° C., heating was stopped and the reaction solution was cooled to room temperature. The precipitate thus produced was collected by filtration under reduced pressure and then washed with 1,000 g of ethanol. The precipitate was vacuum-dried at 40° C. for 24 hours to obtain a white fine crystal. Yield: 1,550 g Synthesis Example 5

Vinylphosphonic Acid/Acrylamide Copolymer (Molar Ratio of 5:95) (I-5)

In a 10 liter flask equipped with a stirrer, a capacitor and a dropping device, 3,500 g of ethanol was charged and heated to 70° C. Then, 118.5 g (1.10 mol) of a vinylphosphonic acid monomer, 1481.5 g (20.84 mol) of acrylamide and 52 g of AIBN were dissolved in 1,000 g of ethanol and the obtained solution was added dropwise in a reactor over 4 hours. During the dropwise addition of a monomer solution, a white precipitate was produced. After heating and stirring for 2 hours while maintaining at 70° C., heating was stopped and the reaction solution was cooled to room temperature. The precipitate thus produced was collected by filtration under reduced pressure and then washed with 1,000 g of ethanol. The precipitate was vacuum-dried at 40° C. for 24 hours to obtain a white fine crystal. Yield: 1,550 g Comparative Synthesis Example 1

Vinylphosphonic Acid/Acrylamide Copolymer (Molar Ratio of 8:2) (C-1)

In a 10 liter flask equipped with a stirrer, a capacitor and a dropping device, 3,500 g of ethanol was charged and heated to 70° C. Then, 1,374 g (12.72 mol) of a vinylphosphonic acid monomer, 226 g (3.18 mol) of acrylamide and 52 g of AIBN were dissolved in 1,000 g of ethanol and the obtained solution was added dropwise in a reactor over 4 hours. During the dropwise addition of a monomer solution, a white precipitate was produced. After heating and stirring for 2 hours while maintaining at 70° C., heating was stopped and the reaction solution was cooled to room temperature. The precipitate thus produced was collected by filtration under reduced pressure and then washed with 1,000 g of ethanol. The precipitate was vacuum-dried at 40° C. for 24 hours to obtain a white fine crystal. Yield: 1,550 g Comparative Synthesis Example 2

Polyvinylphosphonic Acid (C-2)

In a 10 liter flask equipped with a stirrer, a capacitor and a dropping device, 3,500 g of ethyl acetate was charged and heated to 70° C. Then, 1,950 g (18.05 mol) of a vinylphosphonic acid monomer and 52 g of AIBN were dissolved in 1,000 g of ethyl acetate and the obtained solution was added dropwise in a reactor over 4 hours. During the dropwise addition of a monomer solution, a white precipitate was produced. After heating and stirring for 2 hours while maintaining at 70° C., heating was stopped and the reaction solution was cooled to room temperature. The precipitate thus produced was collected by filtration under reduced pressure and then washed with 1,000 g of ethyl acetate. The precipitate was vacuum-dried at 40° C. for 24 hours to obtain a white fine crystal. Yield: 1,850 g Comparative Synthesis Example 3

Vinylphosphonic Acid/Methacrylic Acid Copolymer (Molar Ratio of 2:8) (C-3)

In a 10 liter flask equipped with a stirrer, a capacitor and a dropping device, 3,500 g of ethyl acetate was charged and heated to 70° C. Then, 390 g (3.61 mol) of a vinylphosphonic acid monomer, 1,243 g (14.44 mol) of methacrylic acid and 52 g of AIBN were dissolved in 1,000 g of ethyl acetate and the obtained solution was added dropwise in a reactor over 4 hours. During the dropwise addition of a monomer solution, a white precipitate was produced. After heating and stirring for 2 hours while maintaining at 70° C., heating was stopped and the reaction solution was cooled to room temperature. The precipitate thus produced was collected by filtration under reduced pressure and then washed with 1,000 g of ethyl acetate. The precipitate was vacuum-dried at 40° C. for 24 hours to obtain a white fine crystal. Yield: 1,550 g Comparative Synthesis Example 4

Vinylphosphonic Acid/Acrylamide Copolymer (Molar Ratio of 45:55) (C-4)

In a 10 liter flask equipped with a stirrer, a capacitor and a dropping device, 3,500 g of ethanol was charged and heated to 70° C. Then, 886.7 g (8.21 mol) of a vinylphosphonic acid monomer, 713.3 g (10.03 mol) of acrylamide and 52 g of AIBN were dissolved in 1,000 g of ethanol and the obtained solution was added dropwise in a reactor over 4 hours. During the dropwise addition of a monomer solution, a white precipitate was produced. After heating and stirring for 2 hours while maintaining at 70° C., heating was stopped and the reaction solution was cooled to room temperature. The precipitate thus produced was collected by filtration under reduced pressure and then washed with 1,000 g of ethanol. The precipitate was vacuum-dried at 40° C. for 24 hours to obtain a white fine crystal. Yield: 1,550 g Comparative Synthesis Example 5

Acrylamide Homopolymer (C-5)

In a 10 liter flask equipped with a stirrer, a capacitor and a dropping device, 3,500 g of ethanol was charged and heated to 70° C. Then, 1,600 g (22.51 mol) of acrylamide and 52 g of AIBN were dissolved in 1,000 g of ethanol and the obtained solution was added dropwise in a reactor over 4 hours. During the dropwise addition of a monomer solution, a white precipitate was produced. After heating and stirring for 2 hours while maintaining at 70° C., heating was stopped and the reaction solution was cooled to room temperature. The precipitate thus produced was collected by filtration under reduced pressure and then washed with 1,000 g of ethanol. The precipitate was vacuum-dried at 40° C. for 24 hours to obtain a white fine crystal. Yield: 1,550 g <Preparation of Substrate>

A 0.24 mm thick aluminum plate was degreased in an aqueous sodium hydroxide solution and then subjected to an electrolytic graining treatment in a 20% hydrochloric acid bath to obtain a grained plate having a center-line average roughness (Ra) of 0.5 μm. Then, the grained plate was subjected to an anodizing treatment in a 20% hydrochloric acid bath at a current density of 2 A/dm$^2$ to form an oxide film (2.7 g/m$^2$), followed by washing with water and then drying to obtain an aluminum substrate. The substrate thus obtained was dipped in each of solutions 1 to 4 and Comparatives 1 to 3 for coating of an interlayer, shown in Table 1, heated to 60° C. for 10 seconds, washed with water and then dried. Thus, substrates for a lithographic printing plate precursor shown in Table 2 were obtained.

TABLE 2

| Substrate | No. of solution for coating of interlayer |
|---|---|
| Example 1 | 1 |
| Example 2 | 2 |
| Example 3 | 3 |
| Example 4 | 4 |
| Example 5 | 5 |
| Comparative Example 1 | Comparative 1 |
| Comparative Example 2 | Comparative 2 |
| Comparative Example 3 | Comparative 3 |
| Comparative Example 4 | Comparative 4 |
| Comparative Example 5 | Comparative 5 |

<Synthesis of Binder Resin for Photosensitive Layer>
Synthesis of Resin 1

In a 10 liter flask equipped with a stirrer, a capacitor and a dropping device, 2,990 g of dimethylacetamide was charged and heated to 90° C. Then, 740.5 g of phenylmaleimide, 1,001 g of methacrylamide, 368 g of methacrylic acid, 643 g of acrylonitrile, 203.6 g of Phosmer M (manufactured by Uni-Chemical Co., Ltd.), 222.5 g of styrene, 10.6 g of AIBN and 16 g of n-dodecylmercaptane were dissolved in 2,670 g of dimethylacetamide and the obtained solution was added dropwise in a reactor over 2 hours. After completion of the dropwise addition, 5.3 g of AIBN was charged and the temperature was raised to 100° C., followed by stirring for 4 hours. During stirring, the reaction was conducted by adding 5.3 g of AIBN every 1 hour. After the completion of the reaction, heating was stopped and the reaction solution was cooled to room temperature. The reaction solution was poured into 50 liter of water, and the precipitate produced was collected by filtration under reduced pressure, washed once with water and then collected by filtering again under reduced

TABLE 1

| | | Solution for coating of interlayer | | |
|---|---|---|---|---|
| Solution No. | | Polymer used (numeral is mol % of monomer) | | Concentration (g/L) |
| 1 | I-1 | Vinylphosphonic acid 10 | Acrylamide 90 | 1.0 |
| 2 | I-2 | Vinylphosphonic acid 20 | Acrylamide 80 | 1.0 |
| 3 | I-3 | Vinylphosphonic acid 35 | Acrylamide 65 | 1.0 |
| 4 | I-4 | Phosmer M | Acrylamide 80 | 1.0 |
| 5 | I-5 | Vinylphosphonic acid 5 | Acrylamide 95 | 1.0 |
| Comparative 1 | C-1 | Vinylphosphonic acid 80 | Acrylamide 20 | 1.0 |
| Comparative 2 | C-2 | Vinylphosphonic acid 100 | 0 | 1.0 |
| Comparative 3 | C-3 | Vinylphosphonic acid 20 | Methacrylic acid 80 | 1.0 |
| Comparative 4 | C-4 | Vinylphosphonic acid 45 | Acrylamide 55 | 1.0 |
| Comparative 5 | C-5 | Acrylamide 100 | 0 | 1.0 | pressure. The precipitate was vacuum-dried at 50° C. for 24 hours to obtain a resin 1. The amount of the resin was 2,873 g (yield: 90%).

<Preparation of Lower Layer Coating Solution>

As shown in Table 3, a coating solution of a photosensitive composition (for coating of lower layer) was prepared.

TABLE 3

Coating solution of lower layer photosensitive composition

| | Unit: g |
|---|---|
| Methyl ethyl ketone | 47.28 |
| Propylene glycol monomethyl ether | 28.37 |
| γ-butyrolactone | 9.46 |
| Water | 9.46 |
| Resin 1 | 3.95 |
| Cyanine IR dye A | 0.50 |
| Cyanine IR dye B | 0.40 |
| D11 | 0.10 |
| Paintad 19 (manufactured by Dow Corning) | 0.05 |

<Preparation of Coating Solution for Upper Layer>

As shown in Table 4, a coating solution of a photosensitive composition (for coating of upper layer) was prepared.

TABLE 4

Coating solution of upper layer composition

| | Unit: g |
|---|---|
| Methyl isobutyl ketone | 66.32 |
| Acetone | 19.00 |
| Propylene glycol monomethyl ether acetate | 9.50 |
| SMA resin (average molecular weight: 200) | 4.93 |
| Victoria Pure Blue BOH-M | 0.02 |
| Paintad 19 | 0.05 |

SMA resin: copolymer of styrene and maleic anhydride (molar ratio of 1:1)

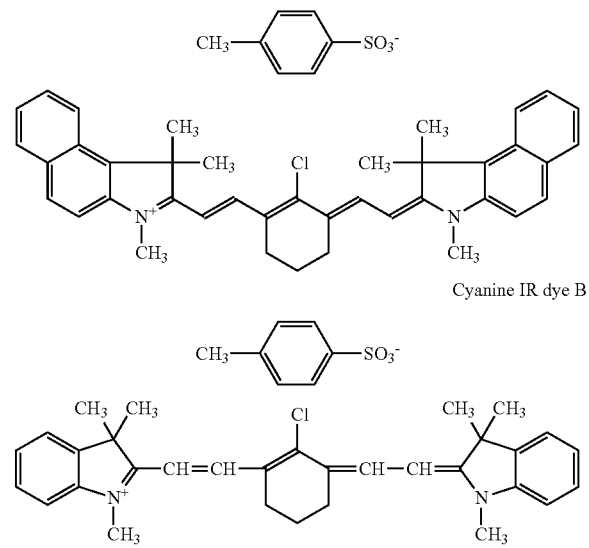

Cyanine IR dye A

Cyanine IR dye B

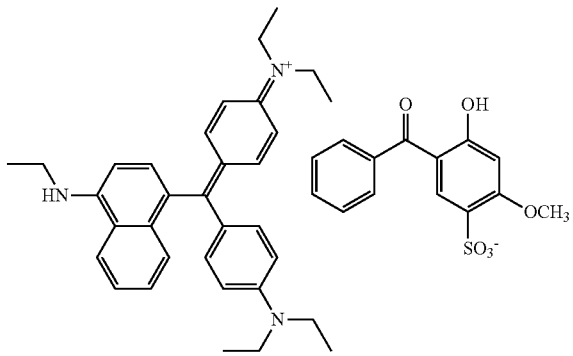

D11

<Preparation of Lithographic Printing Plate Precursor>

On each substrate applied with the solution for coating of an interlayer shown in Table 2, the coating solution of a lower layer photosensitive composition prepared in Table 3 was applied using a roll coater and then dried at 100° C. for 2 minutes. The dry coating weight was 1.5 g/m². On each lower layer, the coating solution of an upper layer composition prepared in Table 4 was applied using a roll coater and then dried at 100° C. for 2 minute. The dry coating weight of the upper layer was 0.5 g/m².

<Preparation of Developing Solution>

A developing solution with the composition shown in Table 5 was prepared. The pH was 11.5 and the conductivity was 1.2 mS/cm.

TABLE 5

Composition of developing solution

| | Unit: g |
|---|---|
| Deionized water | 700 |
| Monoethanolamine | 10 |
| Diethanolamine | 30 |
| Pellex NBL (manufactured by Kao Corporation) | 200 |
| Benzyl alcohol | 60 |

<Image Forming>

The two-layered lithographic printing plate precursor obtained as described above was exposed at 150 mJ/cm² using a PTR4300 setter (manufactured by DAINIPPON SCREEN MFG CO., LTD.), developed with a developing solution prepared by diluting the developing solution shown in Table 5 with water by five times at 30° C. for 15 seconds using an automatic processor (P-940X, manufactured by Kodak's Graphic Communications) and then subjected to gum coating using a finishing gum PF2 (manufactured by Kodak's Graphic Communications) to obtain a lithographic printing plate.

<Evaluation of Cleanup Characteristics and Restart Toning Characteristics>

Using the obtained lithographic printing plate, printing was conducted by a printing press" (R-201: manufactured by Manroland) using a coated paper, a printing ink (Space Color Fusion G Rouge: manufactured by DIC Corporation) and a fountain solution (NA-108W density of 1%: manufactured by Dainippon Ink and Chemicals, Incorporated., IPA 1%). Cleanup (cleanup of stain) characteristics and restart toning (stain upon stopping of printing) characteristics were evaluated by the following procedures.

<Evaluation of Cleanup Characteristics>

After printing 1,000 copies under the above printing conditions, an inking roller was brought into contact with a plate surface thereby depositing an ink on the entire plate surface. After standing for 30 minutes, printing was started and continued until stain of the non-image area were completely removed, and the number of print copies required for complete cleanup of stain was determined. The smaller the number of print copies, the more cleanup characteristics is satisfactory. The evaluation results are shown in Table 6. The lithographic printing plate of Comparative Example 5 could not be used for evaluation because stain generated immediately after the start of printing. The lithographic printing plates of Examples 1 to 5 exhibited excellent stain cleanup performances when compared with Comparative Examples 1 to 5.

TABLE 6

Test results of cleanup characteristics

| | Number of print copies required for cleanup | Remarks |
|---|---|---|
| Example 1 | 30 | |
| Example 2 | 35 | |
| Example 3 | 45 | |
| Example 4 | 50 | |
| Example 5 | 50 | |
| Comparative Example 1 | 70 | |
| Comparative Example 2 | >100 | Shadow could not be recovered |
| Comparative Example 3 | 95 | |
| Comparative Example 4 | 70 | |
| Comparative Example 5 | — | stain generated at start of printing |

<Evaluation of Restart Toning Characteristics>

Using the obtained lithographic printing plate, printing was conducted by a printing press (Roland 201 printing press: manufactured by Manroland) using a coated paper, a printing ink (Space Color Fusion G Rouge: manufactured by DIC Corporation) and a fountain solution (NA-108W density of 1%: manufactured by DIC Corporation, IPA 1%). Restart toning was evaluated by the following procedure.

First, 1,000 copies were printed and printing was stopped in a state where an ink was deposited on a place surface. The plate was heated for 30 minutes by blowing hot air and then printing was reopened. Printing was conducted until fill-in of the ink of the shadow portion was completely removed, and the number of print copies required for complete removing of fill-in was recorded. The evaluation results are shown in Table 7. The lithographic printing plate of Comparative Example 5 could not be used for evaluation because stain generated immediately after the start of printing. The lithographic printing plates of Examples 1 to 5 exhibited excellent stain performances upon stropping of printing when compared with Comparative Examples 1 to 5.

TABLE 7

Test results of restart toning

| | Number of print copies required for cleanup of fill-in | Remarks |
|---|---|---|
| Example 1 | 65 | |
| Example 2 | 90 | |
| Example 3 | 150 | |
| Example 4 | 150 | |
| Example 5 | 150 | |
| Comparative Example 1 | 180 | |
| Comparative Example 2 | >200 | Fill-in of shadow were not removed |
| Comparative Example 3 | >200 | Fill-in of shadow were not removed |
| Comparative Example 4 | 175 | |
| Comparative Example 5 | — | stain generated at start of printing |

<Evaluation of Cleanup Characteristics Using Synthetic Paper>

Using the obtained lithographic plate printing, printing was conducted by a printing press (R-201: manufactured by Manroland) using a synthetic paper FGS80 (manufactured by Yolo Corporation), a printing ink (POP-K Rouge: manufactured by DIC Corporation) and a fountain solution (NA-108W density of 1%: manufactured by DIC Corporation, IPA1%). Cleanup characteristics using the synthetic paper were evaluated by the following procedure.

After printing 1,000 copies under the above printing conditions, an inking roller was brought into contact with a plate surface thereby depositing an ink on the entire plate surface. After standing for 30 minutes, printing was started and continued until stain of the non-image area were completely removed, and the number of print copies required for complete cleanup of stain was determined. The smaller the number of print copies, the more cleanup characteristics is satisfactory. The evaluation results are shown in Table 8. The lithographic printing plate of Comparative Example 5 could not be used for evaluation because stain generated immediately after the start of printing. The lithographic printing plates of Examples 1 to 5 exhibited excellent stain cleanup performances using the synthetic paper when compared with Comparative Examples 1 to 5.

TABLE 8

Test results of cleanup characteristics (using synthetic paper)

| | Number of print copies required for cleanup | Remarks |
|---|---|---|
| Example 1 | 60 | |
| Example 2 | 70 | |
| Example 3 | 90 | |
| Example 4 | 100 | |
| Example 5 | 100 | |
| Comparative Example 1 | 170 | |
| Comparative Example 2 | >200 | Sensitizing-stain of the non-image area were not removed |
| Comparative Example 3 | >200 | Sensitizing-stain of the non-image area were not removed |
| Comparative Example 4 | 150 | |
| Comparative Example 5 | — | Stain generated at start of printing |

The invention claimed is:

1. A lithographic printing plate precursor comprising a substrate having thereon in order an interlayer containing a copolymer comprising K units and L units, and an image-forming layer that comprises a photothermal conversion material, wherein said K unit is derived from a monomer of the formula I:

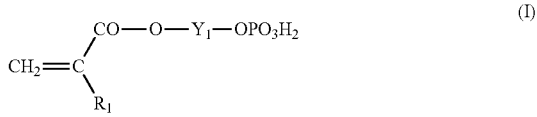

wherein $R^1$ represents a hydrogen atom, a $C_{1-22}$ linear, branched or cyclic alkyl group, a $C_{1-22}$ linear, branched or cyclic, substituted alkyl group, a $C_{6-24}$ aryl group or substituted aryl group, wherein the substituent on the substituted alkyl or aryl group is selected from a $C_{1-4}$ alkyl group, an aryl group, a halogen atom, a keto group, an ester group, an alkoxy group, or a cyano group; $Y_1$ represents an alkyleneoxyalkylene or poly(alkyleneoxy) alkylene group having 2 or 3 carbon atoms in the alkylene group; or from the monomer $CH_2=CHPO(OH)_2$; and said L unit is derived from a monomer of the formula II:

wherein R is H or $CH_3$, and said K units are present in the copolymer in an amount of from more than 3% and less than 40% and said L units are present in the copolymer in an amount of from more than 60% and less than 97%, both based on the total moles of recurring units in the copolymer.

2. The lithographic printing plate precursor according to claim 1, wherein the copolymer further comprises units derived from a monomer containing an onium group or a monomer containing a sulfonic acid group.

3. The lithographic printing plate precursor according to claim 1, wherein the substrate is a roughened sulfuric acid-anodized aluminum substrate.

4. The lithographic printing plate precursor according to claim 1, wherein the K units are derived from a monomer selected from the group consisting of vinyl phosphonic acid and ethylene glycol methacrylate phosphate, and the L units are derived from a monomer selected from the group consisting of acrylamide and methacrylamide.

5. The lithographic printing plate precursor according to claim 1, wherein the image-forming layer is a positive working image-forming layer.

6. The lithographic printing plate precursor according to claim 1, wherein the image-forming layer is a negative working image-forming layer.

7. The lithographic printing plate precursor of claim 1, wherein the K units are present in an amount of at least 3% to 35%, and the L units are present in an amount of at least 65% to 95%, based on the total moles of recurring units in the copolymer.

8. The lithographic printing plate precursor of claim 1 that is positive-working and comprises two image-forming layers disposed over the interlayer.

9. The lithographic printing plate precursor of claim 1, wherein the image-forming layer is an on-press developable negative-working image-forming layer.

10. The lithographic printing plate precursor of claim 1, wherein the image-forming layer comprises an infrared radiation sensitive dye.

11. The lithographic printing plate precursor of claim 1, wherein the interlayer is present at a coverage of 5 mg/m² to 40 mg/m² based on dry mass.

12. The lithographic printing plate precursor of claim 1, wherein the interlayer further comprises sulfuric acid, phosphoric acid, an organic acid, poly(methacrylic acid), or an inorganic salt.

13. The lithographic printing plate precursor of claim 1, wherein the interlayer comprises the copolymer that comprises:
K units derived from one or more of vinyl phosphonic acid, ethylene glycol acrylate phosphate, ethylene glycol methacrylate phosphate, polyethylene glycol acrylate phosphate, polyethylene glycol methacrylate phosphate, polypropylene glycol acrylate phosphate, and polypropylene glycol methacrylate phosphate, and
L units derived from acrylamides or methacrylamide.

14. The lithographic printing plate precursor of claim 13, wherein the K units are present in the copolymer in an amount of from 10% to 35%, and the L units are present in the copolymer in an amount of from 65% to 90%, based on total moles of recurring units in the copolymer.

15. The lithographic printing plate precursor of claim 13, wherein the copolymer further comprises 1% to 2%, based on total moles of recurring units, of one or more of 3-(acrylamidepropyl)trimethylammonium chloride, diaryldimethylammonium chloride, methacryloylcholine chloride, aryl sulfonic acid, styrenesulfonic acid, and 2-acrylamide-2-methylpropanesulfonic acid.

16. The lithographic printing plate precursor of claim 1, wherein the image-forming layer further comprises an aqueous alkali soluble or dispersible resin.

17. A method for forming a lithographic printing plate, comprising:
imagewise exposing the lithographic printing plate precursor of claim 1 that is a positive-working lithographic printing plate precursor to provide exposed areas and non-exposed areas in the image-forming layer, and
removing the exposed areas in the image-forming layer.

18. The method of claim 17 comprising imagewise exposing the lithographic printing plate precursor using an infrared radiation laser.

19. The method of claim 17, comprising removing the exposed areas of the image-forming layer with an aqueous alkali solution.

* * * * *